US008456483B2

(12) United States Patent
Han

(10) Patent No.: US 8,456,483 B2

(45) Date of Patent: Jun. 4, 2013

(54) IMAGE COLOR BALANCE ADJUSTMENT FOR DISPLAY PANELS WITH 2D SUBIXEL LAYOUTS

(75) Inventor: Seok-Jin Han, Cupertino, CA (US)

(73) Assignee: Samsung Display Co., Ltd. (KR)

( * ) Notice: Subject to any disclaimer, the term of this patent is extended or adjusted under 35 U.S.C. 154(b) by 751 days.

(21) Appl. No.: 12/600,642

(22) PCT Filed: Apr. 29, 2008

(86) PCT No.: PCT/US2008/061906

§ 371 (c)(1), (2), (4) Date: Nov. 17, 2009

(87) PCT Pub. No.: WO2008/144180

PCT Pub. Date: Nov. 27, 2008

(65) Prior Publication Data

US 2010/0149204 A1 Jun. 17, 2010

Related U.S. Application Data

(60) Provisional application No. 60/938,989, filed on May 18, 2007.

(51) Int. Cl.

| | |
|---|---|
| ***G09G 5/00*** | (2006.01) |
| ***G09G 5/02*** | (2006.01) |
| ***G09G 5/10*** | (2006.01) |
| ***G09G 3/34*** | (2006.01) |
| ***H04N 1/46*** | (2006.01) |
| ***H04N 1/40*** | (2006.01) |
| ***H04N 5/21*** | (2006.01) |
| ***H04N 9/73*** | (2006.01) |
| ***G03F 3/08*** | (2006.01) |
| ***G06K 9/40*** | (2006.01) |

(52) U.S. Cl.

USPC ........... 345/581; 345/611; 345/591; 345/603; 345/690; 345/77; 348/252; 348/625; 348/630; 348/655; 358/516; 358/518; 358/525; 358/448; 382/167; 382/260; 382/269; 382/274

(58) Field of Classification Search

USPC ................. 345/418, 428, 581, 589–591, 593, 345/600, 603–604, 606, 611, 619, 644, 204, 345/690, 698–699, 22, 48, 55, 63, 77, 83–84, 345/87; 348/252, 273, 277, 552, 557–558, 348/571, 625, 630, 655, 708; 358/512, 516, 358/518, 523–525, 447–448; 382/162, 165–167, 382/254, 260–261, 266, 269, 274, 299–300

See application file for complete search history.

(56) References Cited

U.S. PATENT DOCUMENTS

| | | | | |
|---|---|---|---|---|
| 7,123,277 | B2 * | 10/2006 | Brown Elliott et al. | 345/690 |
| 2004/0234163 | A1 * | 11/2004 | Lee et al. | 382/298 |

(Continued)

FOREIGN PATENT DOCUMENTS

| | | | |
|---|---|---|---|
| WO | 2004079704 | A2 | 9/2004 |
| WO | 2006025359 | A1 | 3/2006 |
| WO | 2006127555 | A2 | 11/2006 |

OTHER PUBLICATIONS

International Search Report dtd Aug. 20, 2008 (1 page).

(Continued)

*Primary Examiner* — Wesner Sajous

(74) *Attorney, Agent, or Firm* — Innovation Counsel LLP

(57) ABSTRACT

The subpixel rendering component of a display system provides the capability to substitute a second subpixel rendering filter for a first subpixel rendering filter for computing the values of certain subpixels on the display panel when the input image data being rendered indicates an image feature that may give rise to a color balance error at some portion of the displayed output image. An image processing method of correcting for color balance errors detects the location of a subpixel being rendered and for certain subpixels, detects whether the input image data indicates the presence of a particular image feature. When the image feature is detected for particular subpixels being processed, a second subpixel rendering image filter is substituted for a first subpixel rendering image filter.

9 Claims, 9 Drawing Sheets

U.S. PATENT DOCUMENTS

| | | | | |
|---|---|---|---|---|
| 2005/0134600 | A1 | 6/2005 | Credelle et al. | |
| 2005/0225567 | A1* | 10/2005 | Saito | 345/629 |
| 2005/0225569 | A1* | 10/2005 | Kim | 345/653 |
| 2005/0225575 | A1* | 10/2005 | Brown Elliott et al. | 345/694 |
| 2007/0109327 | A1 | 5/2007 | Cok et al. | |
| 2007/0285442 | A1* | 12/2007 | Higgins | 345/690 |
| 2009/0046108 | A1* | 2/2009 | Brown Elliott et al. | 345/603 |
| 2011/0141131 | A1* | 6/2011 | Brown Elliott et al. | 345/589 |
| 2012/0026216 | A1* | 2/2012 | Brown Elliott et al. | 345/694 |

OTHER PUBLICATIONS

European Search Report Corresponding to EP 08 76 9235, Feb. 3, 2011, 7 pages.

* cited by examiner

IMAGE COLOR BALANCE ADJUSTMENT FOR DISPLAY PANELS WITH 2D SUBIXEL LAYOUTS

FIELD OF INVENTION

The subject matter of the present application is related to image display devices, and in particular to an image processing method for achieving the display of a color-balanced white color at the edges of a display panel configured with a two-dimensional (2D) high-brightness sub-pixel layout.

BACKGROUND

Commonly owned U.S. Pat. No. 7,123,277 entitled "CONVERSION OF A SUB-PIXEL FORMAT DATA TO ANOTHER SUB-PIXEL DATA FORMAT," issued to Elliott et al., discloses a method of converting input image data specified in a first format of primary colors for display on a display panel substantially comprising a plurality of subpixels. The subpixels are arranged in a subpixel repeating group having a second format of primary colors that is different from the first format of the input image data. Note that in U.S. Pat. No. 7,123,277, subpixels are also referred to as "emitters." U.S. Pat. No. 7,123,277 is hereby incorporated by reference herein for all that it teaches.

The term "primary color" refers to each of the colors that occur in the subpixel repeating group. When a subpixel repeating group is repeated across a display panel to form a device with the desired matrix resolution, the display panel is said to substantially comprise the subpixel repeating group. In this discussion, a display panel is described as "substantially" comprising a subpixel repeating group because it is understood that size and/or manufacturing factors or constraints of the display panel may result in panels in which the subpixel repeating group is incomplete at one or more of the panel edges. In addition, any display would "substantially" comprise a given subpixel repeating group when that display had a subpixel repeating group that was within a degree of symmetry, rotation and/or reflection, or any other insubstantial change, of one of the embodiments of a subpixel repeating group illustrated herein or in any one of the issued patents or patent application publications referenced below.

By way of example, the format of the color image data values that indicate an input image may be specified as a two-dimensional array of color values specified as a red (R). green (G) and blue (B) triplet of data values. Thus, each RGB triplet specifies a color at a pixel location in the input image. The display panel of display devices of the type described in U.S. Pat. No. 7,123,277 and in other commonly-owned patent application publications referenced below, substantially comprises a plurality of a subpixel repeating group that specifies a different, or second, format in which the input image data is to be displayed. In one embodiment, the subpixel repeating group is two-dimensional (2D); that is, the subpixel repeating group comprises subpixels in at least first, second and third primary colors that are arranged in at least two rows on the display panel. In some 2D subpixel repeating groups, the subpixels of two of the primary colors are arranged in what is referred to as a "checkerboard pattern." That is, a second primary color subpixel follows a first primary color in a first row of the subpixel repeating group, and a first primary color subpixel follows a second primary color in a second row of the subpixel repeating group. Examples of such sub-pixel repeating groups are shown in FIG. 12.

Performing the operation of subpixel rendering the input image data produces a luminance value for each subpixel on the display panel such that the input image specified in the first format is displayed on the display panel comprising the second, different arrangement of primary colored subpixels in a manner that is aesthetically pleasing to a viewer of the image. As noted in U.S. Pat. No. 7,123,277, subpixel rendering operates by using the subpixels as independent pixels perceived by the luminance channel. This allows the subpixels to serve as sampled image reconstruction points as opposed to using the combined subpixels as part of a "true" (or whole) pixel. By using subpixel rendering, the spatial reconstruction of the input image is increased, and the display device is able to independently address, and provide a luminance value for, each subpixel on the display panel.

The subpixel rendering operation disclosed in U.S. Pat. No. 7,123,277 generally proceeds as follows. The input color image data from a portion, or area, of the input image is used to produce the luminance value for each subpixel on the display panel using an image filter comprising a matrix of coefficients. These coefficients are computed using a technique referred to as "area resampling." The location of each primary color subpixel on the display panel approximates what is referred to as a reconstruction point (or resample point) used by the subpixel rendering operation to reconstruct a portion of an input image. Each reconstruction point is centered inside a resample area which defines the size of the area of the input image that potentially contributes to the luminance value of the subpixel. The set of subpixels on the display panel for each primary color is referred to as a primary color plane, and the plurality of resample areas for one of the primary colors comprises a resample area array for that color plane. The input color image data is represented as a set of tiled input image sample areas. The resample area array overlays the set of tiled input image sample areas such that each resample area overlays some portion of at least one, but typically more than one, input image sample area. The luminance value for the subpixel represented by a resample point is a function of the ratio of the area of each input image sample area that is overlapped by the resample area to the total area of the resample area.

The area resample function is represented as an image filter, with each filter kernel coefficient representing a multiplier for an input image data value of a respective input image sample area. More generally, these coefficients may also be viewed as a set of fractions for each resample area. In one embodiment, the denominators of the fractions may be construed as being a function of the resample area and the numerators as being the function of an area of each of the input sample areas that at least partially overlaps the resample area. The set of fractions thus collectively represent the image filter, which is typically stored as a matrix of coefficients. In one embodiment, the total of the coefficients is substantially equal to one. The data value for each input sample area is multiplied by its respective fraction and all products are added together to obtain a luminance value for the resample area (subpixel). The size of the matrix of coefficients that represent a filter kernel is typically related to the size and shape of the resample area for the reconstruction points and how many input image sample areas a given resample area overlaps.

In addition, in some embodiments of the techniques disclosed in U.S. Pat. No. 7,123,277, the subpixel rendering operation may be implemented in a manner that maintains the color balance among the subpixels on the display panel by ensuring that high spatial frequency information in the luminance component of the image to be rendered does not alias with the color subpixels to introduce color errors. An arrangement of the subpixels in a subpixel repeating group might be suitable for subpixel rendering if subpixel rendering image data upon such an arrangement may provide an increase in both spatial addressability, which may lower phase error, and in the Modulation Transfer Function (MTF) high spatial frequency resolution in both horizontal and vertical axes of the display.

Because the subpixel rendering operation renders information to the display panel at the individual subpixel level, the term "logical pixel" is introduced. A logical pixel may have an approximate Gaussian intensity distribution and may overlap other logical pixels to create a full image. Each logical pixel may be defined as a collection of nearby subpixels (e.g., at least one other subpixel) and has a target subpixel, which may be any one of the primary color subpixels, for which an image filter will be used to produce a luminance value. Thus, each subpixel on the display panel is actually used multiple times, once as a center, or target, of a logical pixel, and additional times as the edge or component of another logical pixel.

References to display systems or devices using more than three primary subpixel colors to form color images may also be referred to herein as "multi-primary" display systems. In a display panel having a subpixel repeating group that includes a white (W), or clear, subpixel, the white subpixel represents a primary color. Commonly-owned U.S. Patent Application Publication 2005/0225575, entitled "NOVEL SUBPIXEL LAYOUTS AND ARRANGEMENTS FOR HIGH BRIGHTNESS DISPLAYS," discloses a plurality of multi-primary high brightness display panels and devices comprising subpixel repeating groups having at least one white subpixel and a plurality of saturated primary color subpixels. The saturated primary color subpixels may comprise red, blue, green, cyan or magenta in these various embodiments. Commonly-owned U.S. Patent Application Publication 2005/0225563, entitled "SUBPIXEL RENDERING FILTERS FOR HIGH BRIGHTNESS SUBPIXEL LAYOUTS," discloses subpixel rendering techniques for rendering source (input) image data for display on display panels substantially comprising a subpixel repeating group having a white subpixel, including, for example, an RGBW subpixel repeating group. U.S. Patent Application Publications 2005/0225575 and 2005/0225563 are both incorporated by reference herein for all that each teaches.

FIG. 12 herein illustrates display panel 1570 substantially comprising an exemplary RGBW subpixel repeating group 9 which may be substantially repeated across display panel 1570 to form a high brightness display panel. RGBW subpixel repeating group 9 is comprised of eight subpixels disposed in two rows of four columns, and comprises two of red subpixels 2, green subpixels 4, blue subpixels 8 and white (or clear) subpixels 6. If subpixel repeating group 9 is considered to have four quadrants of two subpixels each, then the pair of red and green subpixels are disposed in opposing quadrants, analogous to a "checkerboard" pattern. Other primary colors are also contemplated, including cyan, emerald and magenta. US 2005/0225563 notes that these color names are only "substantially" the colors described as "red", "green", "blue", "cyan", and "white". The exact color points may be adjusted to allow for a desired white point on the display when all of the subpixels are at their brightest state.

The subpixel rendering operation for rendering input image data that is specified in the RGB triplet format described above onto a display panel comprising an RGBW subpixel repeating group of the type shown in FIG. 12 generally follows the area resample principles disclosed and illustrated in U.S. Pat. No. 7,123,277, with some modifications and additions as described in US 2005/0225563. US 2005/0225563 discloses that input image data may be processed as follows: (1) Convert conventional RGB input image data (or data having one of the other common formats such as sRGB, YCbCr, or the like) to color data values in a color gamut defined by R, G, B and W, if needed. This conversion may also produce a separate Luminance (L) color plane or color channel. (2) Perform a subpixel rendering operation on each individual color plane. (3) Perform a sharpening operation using a sharpening filter. For example, use the "L" (or "Luminance") plane to sharpen each color plane, or use a Difference of Gaussian (DOG) Wavelet filter to sharpen the image using a cross-color component or a self-color component.

In very general terms, a sharpening filter moves luminance energy from one area of an image to another. Examples of sharpening filters are provided in commonly-owned US 2005/0225563. A sharpening filter may be convolved with the input image sample points to produce a sharpening value that is added to the results of the area resample filter. If this operation is done with the same color plane, the operation is called self sharpening. In self-sharpening, the sharpening filter and the area resample filter may be summed together and then used on the input image sample points, which avoids the second convolution. If the sharpening operation is done with an opposing color plane, for example convolving the area resample filter with the red input data and convolving the sharpening filter with the green input data, this is called cross-color sharpening. In subpixel rendering operations in which a separate luminosity channel, L, is calculated, such as RGBW subpixel repeating groups, the sharpening filter may be convolved with this luminance signal; this type of sharpening is called cross luminance sharpening. These types of sharpening filters are typically constructed using a single primary color plane.

US 2005/0225563 discloses some general information regarding performing the subpixel rendering operation for RGB subpixel repeating groups that have red and green subpixels arranged in opposing quadrants, or on a "checkerboard." The red and green color planes may use a Difference of Gaussian (DOG) Wavelet filter followed by an Area Resample filter. The Area Resample filter removes any spatial frequencies that will cause chromatic aliasing. The DOG wavelet filter is used to sharpen the image using a cross-color component. That is to say, the red color plane is used to sharpen the green subpixel image and the green color plane is used to sharpen the red subpixel image. US 2005/0225563 discloses an exemplary embodiment of these filters as follows:

TABLE 1

| | | | | | | | | | | | |
|---|---|---|---|---|---|---|---|---|---|---|---|
| −0.0625 | 0 | −0.0625 | | 0 | 0.125 | 0 | | −0.0625 | 0.125 | −0.0625 |
| 0 | 0.25 | 0 | + | 0.125 | 0.5 | 0.125 | = | 0.125 | 0.75 | 0.125 |
| −0.0625 | 0 | −0.0625 | | 0 | 0.125 | 0 | | −0.0625 | 0.125 | −0.0625 |
| DOG Wavelet Filter | | | + | Area Resample Filter | | | | Cross-Color Sharpening Kernel | | |

Commonly owned International Application PCT/US06/19657 entitled MULTIPRIMARY COLOR SUBPIXEL RENDERING WITH METAMERIC FILTERING discloses systems and methods of rendering input image data to multiprimary displays that utilize metamers to adjust the output color data values of the subpixels. International Application PCT/US06/19657 is published as WO International Patent Publication No. 2006/127555, which is hereby incorporated by reference herein. In a multi-primary display in which the subpixels have four or more non-coincident color primaries, there are often multiple combinations of values for the primaries that may give the same color value. That is to say, for a color with a given hue, saturation, and brightness, there may be more than one set of intensity values of the four or more primaries that may give the same color perception to a human viewer. Each such possible intensity value set is called a "metamer" for that color. Thus, a metamer on a display substantially comprising a particular multi-primary subpixel repeating group is a combination (or a set) of at least two groups of colored subpixels such that there exists signals that, when applied to each such group, yields a desired color that is perceived by the Human Vision System. Using metamers provides a degree of freedom for adjusting relative values of the colored primaries to achieve desired goal, such as improving image rendering accuracy or perception. The metamer filtering operation may be based upon input image content and may optimize subpixel data values according to many possible desired effects, thus improving the overall results of the subpixel rendering operation.

WO 2006/127555 also discloses a technique for generating a metamer sharpening filter which, in one embodiment, is a Difference of Gaussians (DOG) Wavelet filter. Metamer sharpening filters are constructed from the union of the resample points from at least two of the color planes. As explained in the commonly-owned WO 2006/127555 publication, the RGBW metamer filtering operation may tend to pre-sharpen, or peak, the high spatial frequency luminance signal, with respect to the subpixel layout upon which it is to be rendered, especially for the diagonally oriented frequencies. This pre-sharpening tends to occur before the area resample filter blurs the image as a consequence of filtering out chromatic image signal components which may alias with the color subpixel pattern. The area resample filter tends to attenuate diagonals more than horizontal and vertical signals. The metamer sharpening filter may operate from the same color plane as the area resample filter, from another color plane, or from the luminance data plane, to sharpen and maintain the horizontal and vertical spatial frequencies more than the diagonal frequencies. The operation of applying a metamer sharpening filter may be viewed as moving intensity values along same color subpixels in the diagonal directions while the metamer filtering operation moves intensity values across different color subpixels. The reader is also referred to WO 2006/127555 for further information.

SUMMARY

The subpixel rendering component of a display system provides the capability to substitute a second subpixel rendering filter for a first subpixel rendering filter for computing the values of certain subpixels on the display panel when the input image data being rendered indicates an image feature that may give rise to a color balance error at some portion of the displayed output image.

An image processing method of correcting for color balance errors detects the location of a subpixel being rendered, and for certain subpixels, detects whether the input image data indicates the presence of a particular image feature. When the image feature is detected for particular subpixels being processed, a second subpixel rendering image filter is substituted for a first subpixel rendering image filter.

BRIEF DESCRIPTION OF THE DRAWINGS

The accompanying drawings are incorporated in, and constitute a part of this specification, and illustrate exemplary implementations and embodiments.

DETAILED DESCRIPTION

Reference will now be made in detail to implementations and embodiments, examples of which are illustrated in the accompanying drawings. Wherever possible, the same reference numbers will be used throughout the drawings to refer to the same or like parts.

Figure 11A:
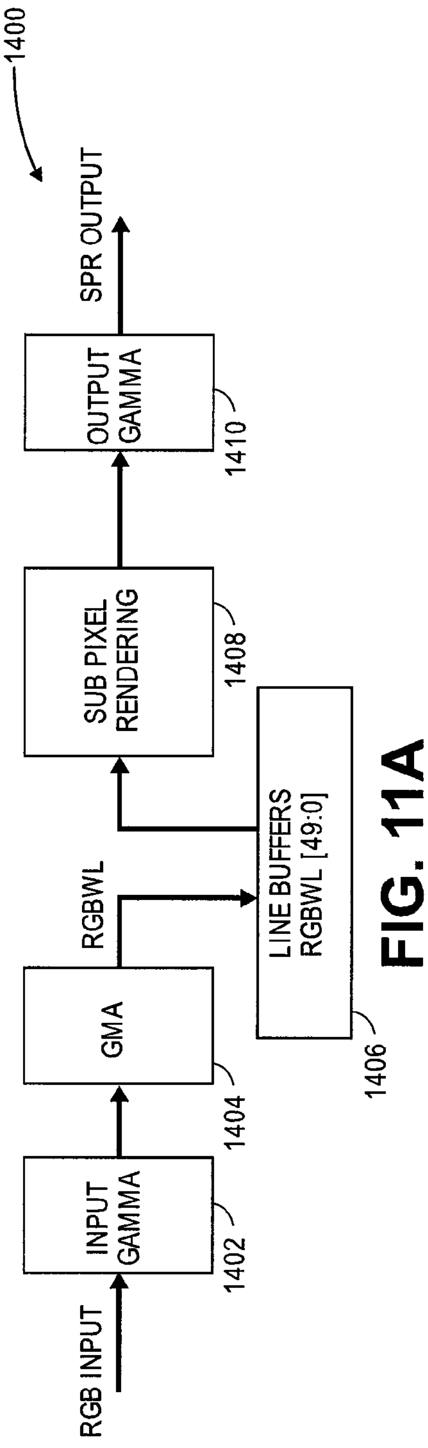
FIGS. 11A and 11B are block diagrams showing the functional components of two embodiments of display devices that perform subpixel rendering operations.
Figure 11B:
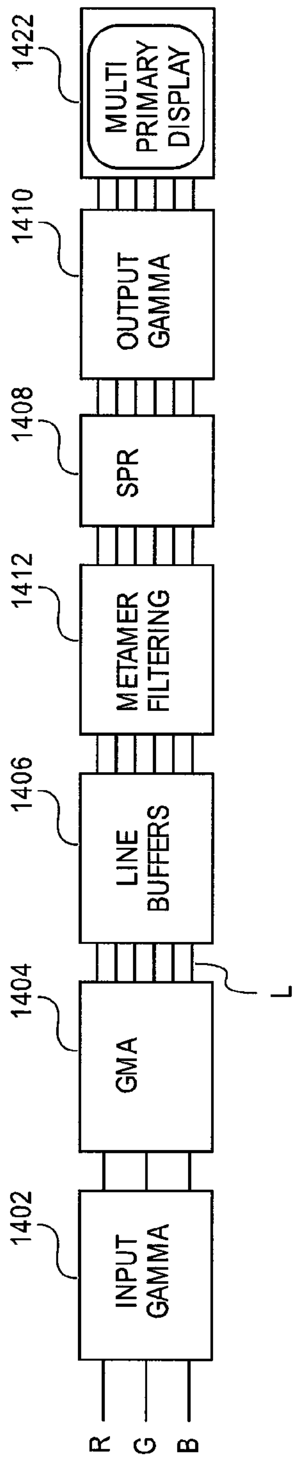

Overview of Display Device Structures for Performing Subpixel Rendering Techniques FIGS. 11A and 11B illustrate the functional components of embodiments of display devices and systems that implement the subpixel rendering operations described above and in the commonly owned patent applications and issued patents variously referenced herein. FIG. 11A illustrates display system 1400 with the data flow through display system 1400 shown by the heavy lines with arrows. Display system 1400 comprises input gamma operation 1402, gamut mapping (GMA) operation 1404, line buffers 1406, SPR operation 1408 and output gamma operation 1410.

Input circuitry provides RGB input data or other input data formats to system 1400. The RGB input data may then be input to Input Gamma operation 1402. Output from operation 1402 then proceeds to Gamut Mapping operation 1404. Typically, Gamut Mapping operation 1404 accepts image data and performs any necessary or desired gamut mapping operation upon the input data. For example, if the image processing system is inputting RGB input data for rendering upon a RGBW display panel, then a mapping operation may be desirable in order to use the white (W) primary of the display. This operation might also be desirable in any general multi-primary display system where input data is going from one color space to another color space with a different number of primaries in the output color space. Additionally, a GMA might be used to handle situations where input color data might be considered as "out of gamut" in the output display space. In display systems that do not perform such a gamut mapping conversion, GMA operation 1404 is omitted. Additional information about gamut mapping operations suitable for use in multiprimary displays may be found in commonly-owned U.S. patent applications which have been published as U.S. Patent Application Publication Nos. 2005/0083352, 2005/0083341, 2005/0083344 and 2005/0225562, all of which are incorporated by reference herein.

With continued reference to FIG. 11A, intermediate image data output from Gamut Mapping operation 1404 is stored in line buffers 1406. Line buffers 1406 supply subpixel rendering (SPR) operation 1408 with the image data needed for further processing at the time the data is needed. For example, an SPR operation that implements the area resample principles disclosed and described above typically employs a matrix of input (source) image data surrounding a given image sample point being processed in order to perform area resample filtering. The size of the matrix of input (source) image data may be related to the size of the image filter kernel used by SPR operation 1408. For example, when a 3×3 filter kernel is used, three data lines are input into SPR 1408 to perform a subpixel rendering operation that may involve neighborhood filtering steps. The use of larger filter kernels may require more line buffers than shown in FIG. 11A to store the input image data. Note that SPR 1408 may employ sharpening filters not explicitly shown in FIG. 11A. After SPR operation 1408, output image data representing the output image to be rendered may be subject to an output Gamma operation 1410 before being output from the system to a display. Note that both input gamma operation 1402 and output gamma operation 1410 may be optional. Additional information about this display system embodiment may be found in, for example, commonly owned United States Patent Application Publication No. 2005/0083352. The data flow through display system 1400 may be referred to as a "gamma pipeline."

FIG. 11B shows a system level diagram 1420 of one embodiment of a display system that employs the techniques discussed in WO 2006/127555 referenced above for subpixel rendering input image data to multi-primary display 1422. Functional components that operate in a manner similar to those shown in FIG. 11A have the same reference numerals. Input image data may consist of 3 primary colors such as RGB or YCbCr that may be converted to multi-primary in GMA module 1404. In display system 1420, GMA component 1404 may also calculate the luminance channel, L, of the input image data signal—in addition to the other multi-primary signals. In display system 1420, the metamer calculations may be implemented as a filtering operation which utilizes area resample filter kernels of the type described herein and involves referencing a plurality of surrounding image data (e.g. pixel or subpixel) values. These surrounding image data values are typically organized by line buffers 1406, although other embodiments are possible, such as multiple frame buffers. Display system 1420 comprises a metamer filtering module 1412 which performs operations as briefly described above, and as described in more detail in WO 2006/127555. In one embodiment of display system 1420, it is possible for metamer filtering operation 1412 to combine its operation with sub-pixel rendering (SPR) module 1408 and to share line buffers 1406. As noted above, this embodiment is called "direct metamer filtering". In another embodiment of display system 1420, it is possible for metamer filtering operation 1412 to also perform a metamer sharpening operation.

Figure 12:
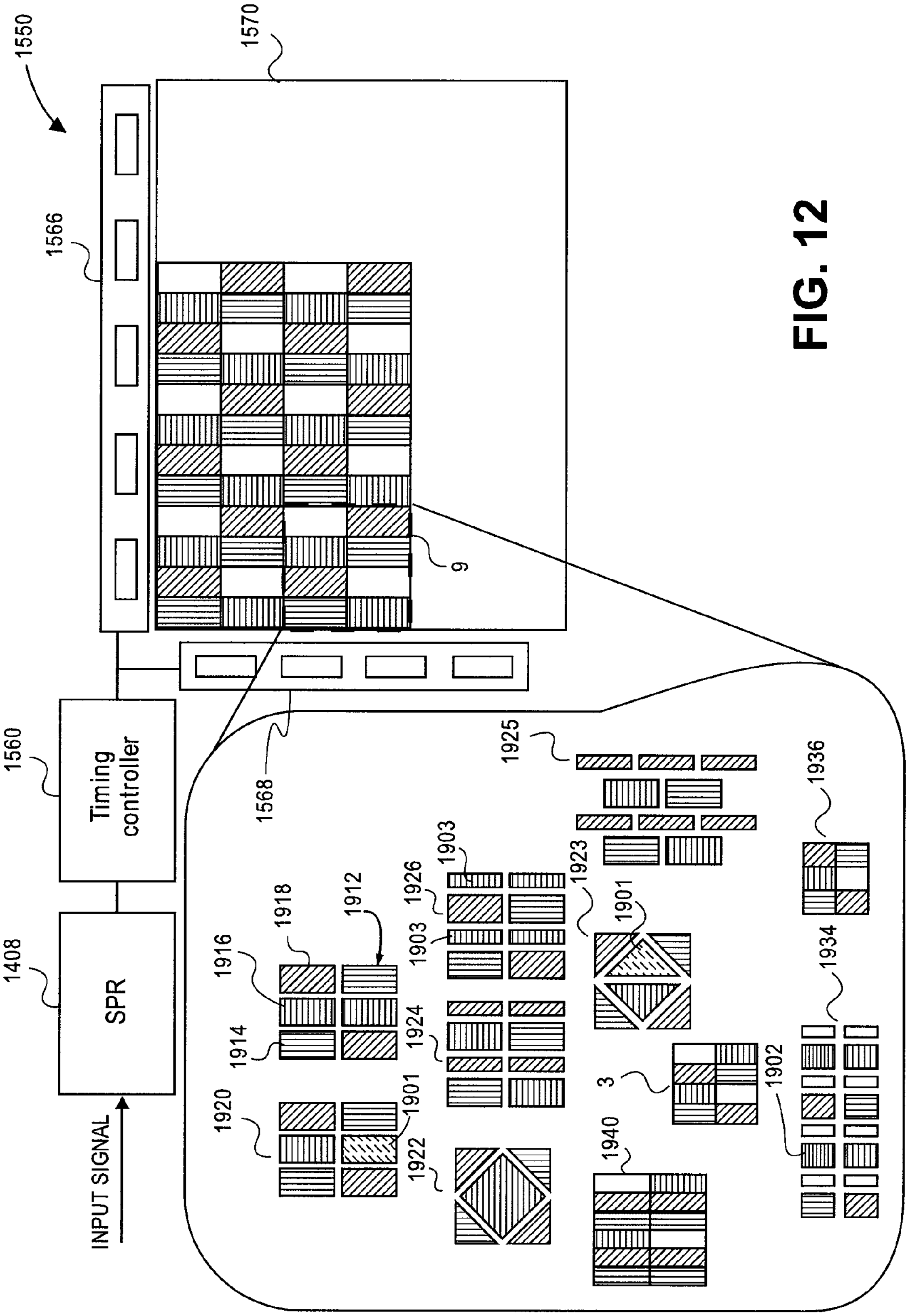
FIG. 12 is a block diagram of a display device architecture schematically illustrating simplified driver circuitry for sending image signals to a display panel comprising one of several embodiments of a subpixel repeating group.

FIG. 12 provides an alternate view of a functional block diagram of a display system architecture suitable for implementing the techniques disclosed herein above. Display system 1550 accepts an input signal indicating input image data. The signal is input to SPR operation 1408 where the input image data may be subpixel rendered for display. While SPR operation 1408 has been referenced by the same reference numeral as used in the display systems illustrated in FIGS. 11A and 11B, it is understood that SPR operation 1408 may also include metamer filtering and sharpening operations, as described in the US 2005/0225563 and WO 2006/127555 publications referenced above.

With continued reference to FIG. 12, in this display system architecture, the output of SPR operation 1408 may be input into a timing controller 1560. Display system architectures that include the functional components arranged in a manner other than that shown in FIG. 12 are also suitable for display systems contemplated herein. For example, in other embodiments, SPR operation 1408 may be incorporated into timing controller 1560, or may be built into display panel 1570 (particularly using LTPS or other like processing technologies), or may reside elsewhere in display system 1550, for example, within a graphics controller. The particular location of the functional blocks in the view of display system 1550 of FIG. 12 is not intended to be limiting in any way.

In display system 1550, the data and control signals are output from timing controller 1560 to driver circuitry for sending image signals to the subpixels on display panel 1570. In particular, FIG. 12 shows column drivers 1566, also referred to in the art as data drivers, and row drivers 1568, also referred to in the art as gate drivers, for receiving image signal data to be sent to the appropriate subpixels on display panel 1570. Display panel 1570 substantially comprises a subpixel repeating grouping 9, which is comprised of a two row by four column subpixel repeating group having four primary colors including white (clear) subpixels. It should be appreciated that the subpixels in repeating group 9 are not drawn to scale with respect to display panel 1570; but are drawn larger for ease of viewing.

As shown in the expanded view, display panel 1570 may substantially comprise other subpixel repeating groups as shown. For example, display panel 1570 may substantially comprise a plurality of subpixel repeating group 1940 comprising twelve subpixels, or a plurality of subpixel repeating group 1920 comprising six subpixels. Note that subpixel repeating group 1920 is a multi-primary subpixel repeating group comprising R, G, B and magenta 1901 subpixels. Subpixel repeating group 1934 is another example of a multi-primary subpixel repeating group comprising R, G, B and cyan 1902 subpixels. Display panel 1570 may also substantially comprise a plurality of a subpixel repeating group not shown in FIG. 12 but is illustrated and described in various ones of the above-referenced applications such as, for example, commonly-owned US 2005/0225575 and US 2005/0225563.

One possible dimensioning for display panel 1570 is 1920 subpixels in a horizontal line (640 red, 640 green and 640 blue subpixels) and 960 rows of subpixels. Such a display would have the requisite number of subpixels to display VGA, 1280×720, and 1280×960 input signals thereon. It is understood, however, that display panel 1570 is representative of any size display panel.

Various aspects of the hardware implementation of the displays described above is also discussed in commonly-owned US Patent Application Publication Nos. US 2005/0212741 (US. 10/807,604) entitled "TRANSISTOR BACKPLANES FOR LIQUID CRYSTAL DISPLAYS COMPRISING DIFFERENT SIZED SUBPIXELS," US 2005/0225548 (U.S. Ser. No. 10/821,387) entitled "SYSTEM AND METHOD FOR IMPROVING SUB-PIXEL RENDERING OF IMAGE DATA IN NON-STRIPED DISPLAY SYSTEMS," and US 2005/0276502 (U.S. Ser. No. 10/866,447) entitled "INCREASING GAMMA ACCURACY IN QUANTIZED SYSTEMS," all of which are hereby incorporated by reference herein. Hardware implementation considerations are also described in International Application PCT/US06/12768 published as International Patent Publication No. WO 2006/108084 entitled "EFFICIENT MEMORY STRUCTURE FOR DISPLAY SYSTEM WITH NOVEL SUBPIXEL STRUCTURES," which is also incorporated by reference herein. Hardware implementation considerations are further described in an article by Elliott et al. entitled "Co-optimization of Color AMLCD Subpixel Architecture and Rendering algorithms," published in the SID Symposium Digest, pp. 172-175, May 2002, which is also hereby incorporated by reference herein.

Subpixel Rendering with Selectable Sharpening Mode

Figure 1:
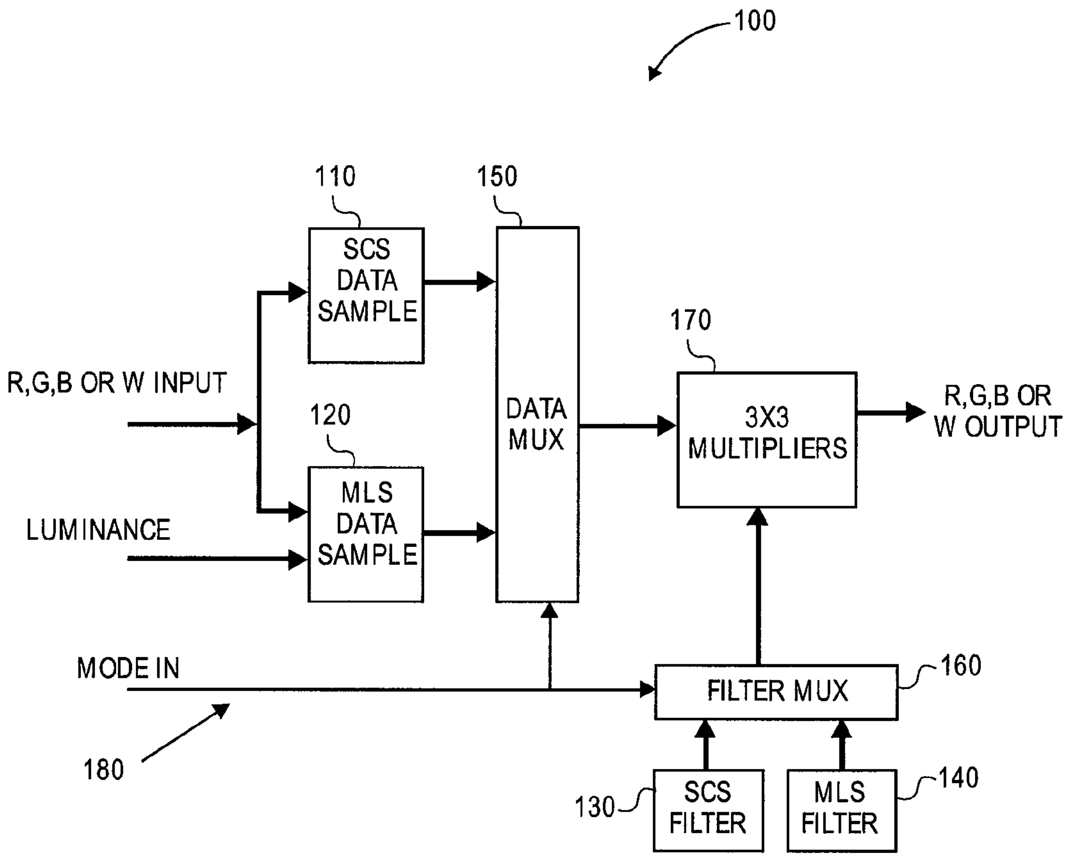
FIG. 1 is a block diagram of an embodiment of a subpixel rendering (SPR) component of a display system which provides first and second user-selectable subpixel rendering modes.

FIG. 1 is a block diagram of one embodiment 100 of SPR module 1408 of FIG. 12 which comprises both of the rendering modes illustrated in FIGS. 11A and 11B above, and in which the desired rendering mode is selectable by the user of the display. Each rendering mode produces a different visually perceptible effect on display panel 1570 (FIG. 12) for the same input image. In embodiment 100 of the selectable sharpening mode illustrated herein, display panel 1570 substantially comprises subpixel repeating group 9 as shown in FIG. 12, and reproduced below for convenience.

| | | | |
|---|---|---|---|
| R | G | B | W |
| B | W | R | G |

With continued reference to FIG. 1, one of the two rendering modes is called Same Color Sharpening (SCS) mode, which implements area resample subpixel rendering as described above and in the cited reference documents, along with a same color sharpening operation. Briefly, in SCS mode, SPR block 100 samples R, G, B or W color input data for a 3×3 area and applies the appropriate SCS image filter in order to calculate an R, G, B or W output subpixel data value, according to the primary color plane (R, G, B or W) being rendered. The second rendering mode implements the metamer filtering operation as described above and in the cited reference document, along with a luminance sharpening operation. This rendering operation is referred to herein as Meta-Luma-Sharpening (MLS). Briefly, in MLS mode, SPR block 100 samples 3×3 data from R, G, B or W color input data and also from a Luminance input, and then applies an appropriate MLS filter. SPR block 100 thus calculates the output values for the subpixels on display panel 1570 using different image filters for each of the two modes. A human user of the display is likely to perceive differences between an image produced on display panel 1570 using SCS mode and the same image produced on display panel 1570 using MLS mode. For example, for some users, the image generated in MLS mode may be perceived to be sharper than the same image generated in SCS mode.

To compute the output data value for each subpixel on display panel 1570 data flow in SPR component 100 proceeds as follows. R, G, B or W color input data is input to both SCS data sampling unit 110 and MLS data sampling unit 120. Luminance input, L, is also input to MLS data sampling unit 120. Data multiplexer (Mux) 150 receives mode selector signal 180, typically generated as a result of a human user preference action, which it uses to select between the output 3×3 SCS data from SCS data sampling unit 110 or output 3×3 MLS data from MLS data sampling unit 120. Filter Mux 160 also receives mode selector signal 180 which it uses to select which 3×3 subpixel rendering filter to apply—SCS Filter 130 or MLS Filter 140. The selected filter is then input to multiplier 170 which computes the output data value for the subpixel being processed.

Figure 2:
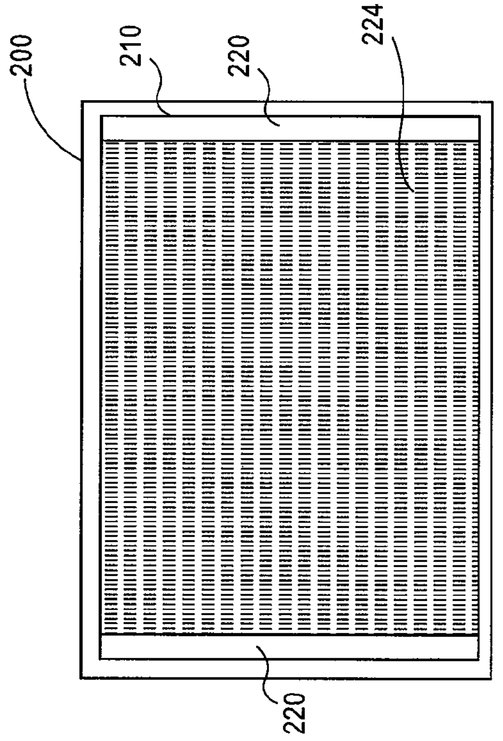
FIG. 2 is an illustration of an exemplary image to be rendered using the subpixel rendering component of FIG. 1.
Figure 3:
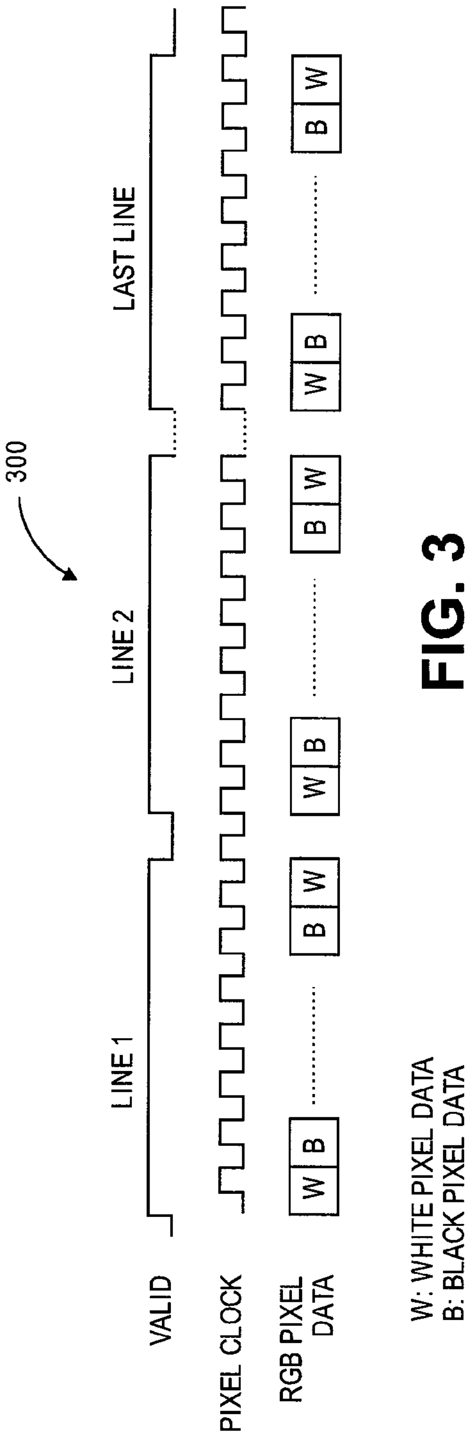
FIG. 3 shows timing diagram 300 for processing the input image pixel data for exemplary image 210 shown in FIG. 2.

FIG. 2 illustrates an exemplary image 210 on display panel 200 that comprises a white vertical line 220 at each image edge with a solid color image region 224 between white image lines 220. Solid color image region 224 could be any continuous color, such as black, that forms a contrasting image region with respect to white image lines 220. FIG. 3 shows timing diagram 300 for processing the input image pixel data for exemplary image 210 shown in FIG. 2. The input RGB pixel data is shown as representing a single vertical white line, denoted as the W pixels, with a solid black image region 224, denoted as the B pixels.

Figure 4:
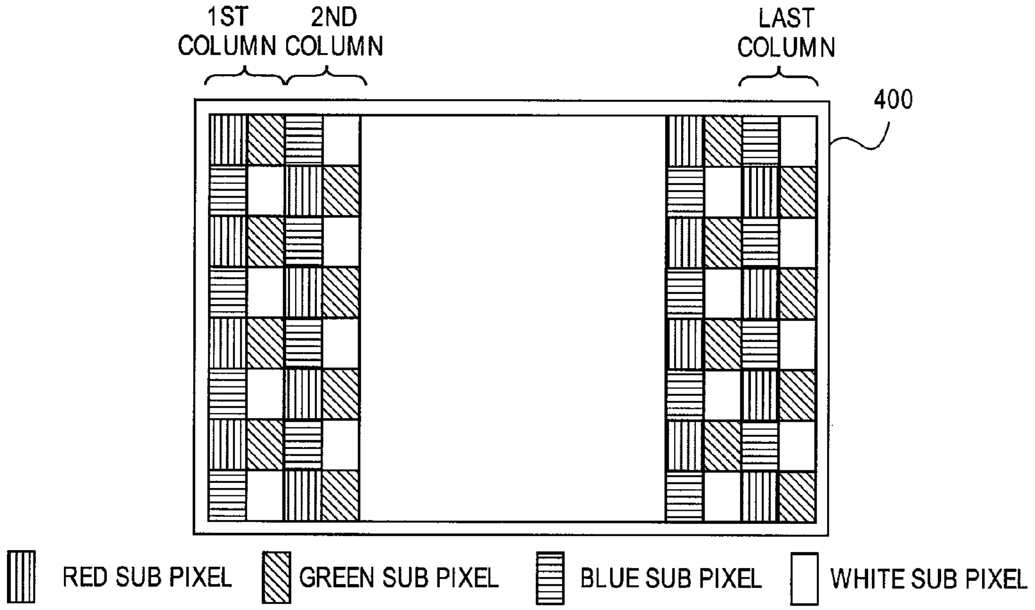
FIG. 4 illustrates a display panel substantially comprising one of the subpixel repeating group illustrated in FIG. 12.

FIG. 4 illustrates display panel 400 substantially comprising subpixel repeating group 9 (FIG. 12), which is shown partially replicated on display panel 400 in a size that is not to scale but shown larger for illustration purposes. In this illustrated embodiment, a single display column on display panel 400 is defined to comprise two columns of subpixels, as called out in the figure. In this embodiment, one input image pixel is mapped to a logical pixel defined by two subpixels on the display panel, such as to a white and blue subpixel pair, and the surrounding alternating input pixels may be mapped to a green and red subpixel pair.

Two possible image filters that may be used for MLS subpixel rendering are:

| WB mapped pixel | | | RG mapped pixel | | |
|---|---|---|---|---|---|
| 0 | −x/4 | 0 | 0 | x/4 | 0 |
| −x/4 | x | −x/4 | x/4 | −x | x/4 |
| 0 | −x/4 | 0 | 0 | x/4 | 0, |

where "X" is a scale factor. The reader is referred to WO 2006/127555 for further information.

Figure 5:
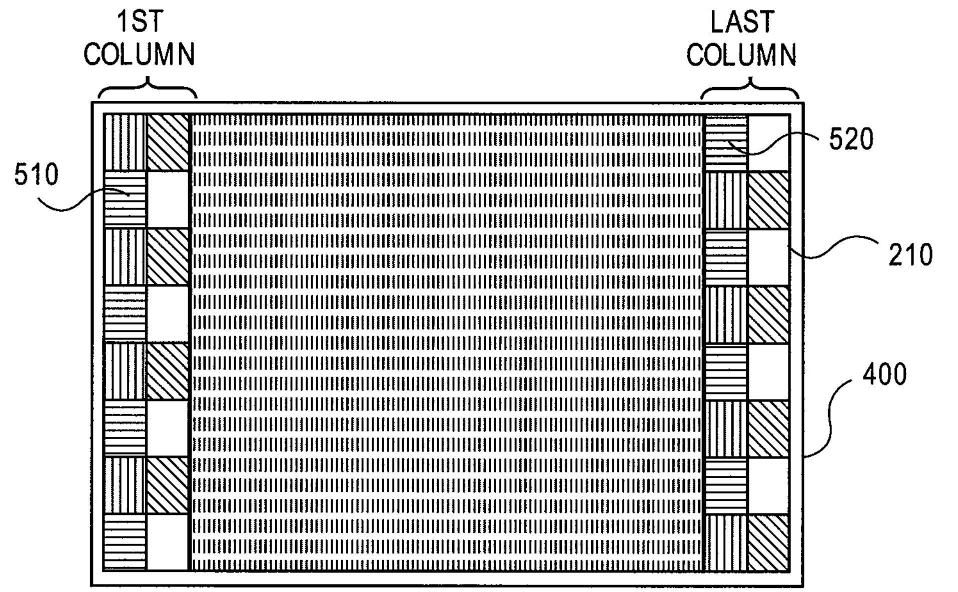
FIG. 5 illustrates the display of the exemplary image of FIG. 2 on the display panel of FIG. 4 using a first one of the subpixel rendering modes of FIG. 1.

FIG. 5 illustrates the display of exemplary image 210 of FIG. 2 on display panel 500 using the SCS mode shown in FIG. 1. FIG. 5 shows the first and last column of sub-pixels turned on at the left and right edges respectively. With these subpixels turned on, the color balance of the white lines at the edges of exemplary image 210 is perceived as a balanced white color, since groups of four RGB and W sub-pixels in each column that produce a balanced white color are evenly turned on. The human user of the display thus perceives identical white lines at the edges of panel 500. FIG. 5 calls out blue sub pixel 520 in an odd line of the image and blue sub-pixel 510 in an even line of the image. Blue sub-pixels are discussed further below.

Figure 6:
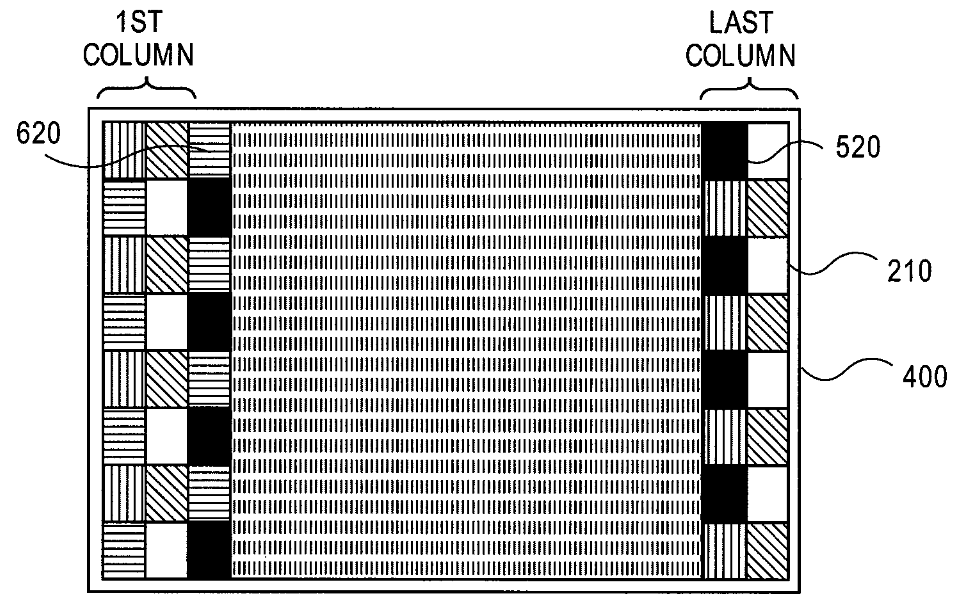
FIG. 6 illustrates the display of the exemplary image of FIG. 2 on the display panel of FIG. 4 using a second one of the subpixel rendering modes of FIG. 1, and illustrating how color balance errors may be introduced into the output image.

FIG. 6 illustrates the display of exemplary image 210 of FIG. 2 on display panel 500 using the MLS mode shown in FIG. 1. FIG. 6 shows which sub-pixels of the first and last column of sub-pixels are turned on at the left and right edges respectively as a result of applying the MLS sub-pixel rendering filter to image 210. As noted above, the MLS image filter computes the data values for the sub-pixels differently than the SCS image filter. FIG. 6 shows a different set of sub-pixels turned on at the edges of image 210. In particular, an additional blue sub-pixel 620 is turned on in the second column at the left edge of image 210, and blue sub-pixel 520 in the last column of image 210 is turned off, as represented by sub-pixel 520 shown in black.

With sub-pixels in the left and right columns turned on and off as shown in FIG. 6, the white lines at the edges of exemplary image 210 are no longer perceived as color balanced white lines. The white line at the left edge of image 210 is perceived as a bluish white color because an extra blue sub-pixel is turned on near the groups of four RGB and W sub-pixels; the human eye integrates these groups of RGBBW sub-pixels into a bluish color. At the right edge of image 210, with the blue sub-pixel 520 turned off in the last column, the human user of the display perceives the white line with a yellowish cast.

Thus, sub-pixel rendering an image in MLS mode may exhibit color balance errors on the extreme left and right edges of a display panel configured with sub-pixel repeating group 9, for some images, such as exemplary image 210 having white lines at the edges adjacent to a dark-colored or black background. The same type of color balance errors may occur on display panels configured with certain other ones of the 2D sub-pixel repeating groups illustrated in FIG. 12. Empirical testing and observation shows that sub-pixel rendering the same image in SCS mode may not exhibit these color balance errors.

Image Color Balance Adjustment

The metameric filtering operation performed with luminance sharpening (MLS mode), as discussed in WO International Patent Publication No. 2006/127555, typically produces both natural and synthetic images on display panels such as panel 400 of FIG. 4 that are perceived as being sharp and aesthetically pleasing to human users. The benefits of sub-pixel rendering in MLS mode may be retained while correcting for the occasional color balance errors by slightly altering how the blue sub-pixels at the edges of an image are processed during the sub-pixel rendering operation. This adjustment may be made for display panels that operate exclusively in MLS mode, or that operate in a selectable sharpening mode, such as a display panel configured as shown in FIG. 1.

One feature of the technique is to substitute a different, or second, filtering operation in place of the MLS, or first, filtering operation, in the case of an input image that has the characteristics of exemplary image 210, in order to alter how the blue sub-pixels at the edges are processed during the sub-pixel rendering operation. The different filtering operation processes the blue sub-pixels at the edges of the image in a manner that preserves color balance for white lines that occur at the edges, while allowing MLS filtering to be used for sub-pixel rendering the remaining portions of the image. This technique retains the benefits of images produced using MLS sub-pixel rendering, such as perceived sharpness, while achieving color accuracy at the edges of images that are likely to exhibit color balance errors if MLS filtering were to be used for the whole image.

FIGS. 7-10 illustrate the technique for image edge color adjustment in the context of the selectable sharpening mode embodiment of sub-pixel rendering operation 100 of FIG. 1. It is to be understood, however, that the basic techniques discussed below may be applied to a display system operating exclusively in MLS mode without a user-selectable option.

Figure 7:
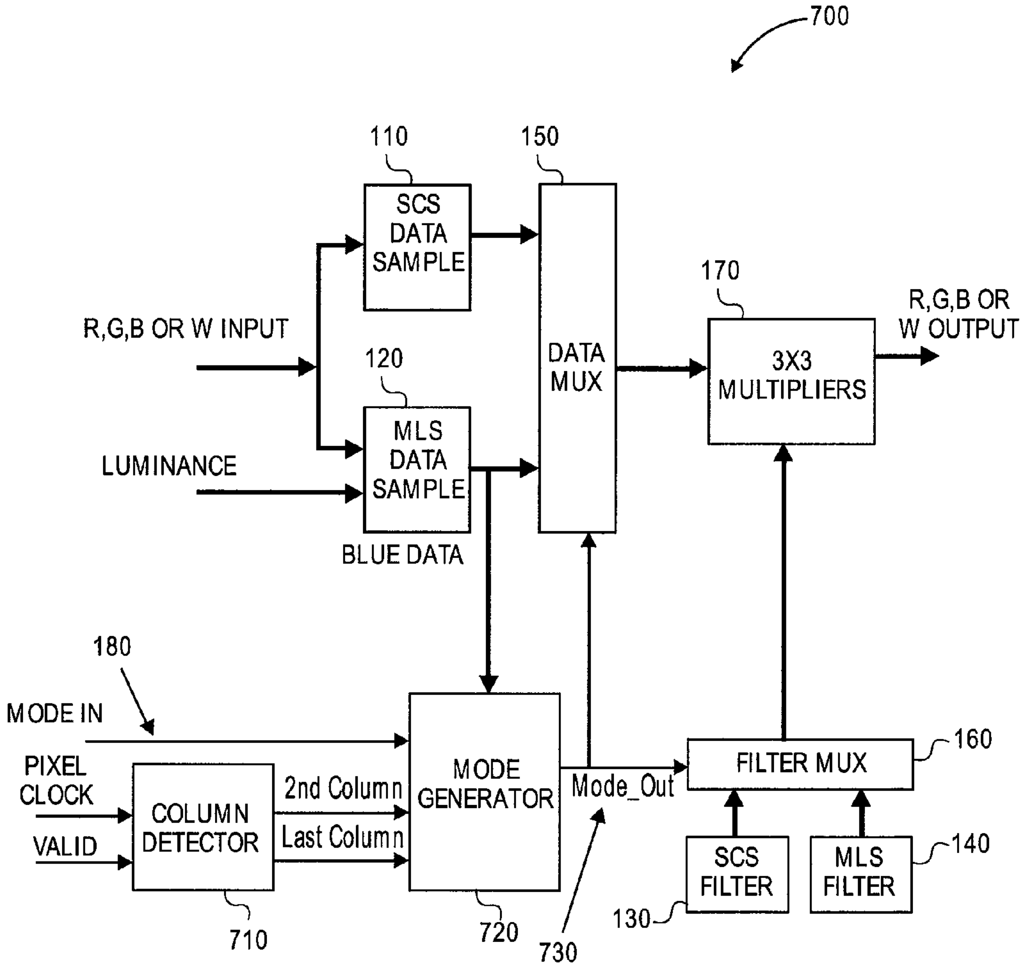
FIG. 7 is a block diagram of an embodiment of the SPR component of FIG. 1 with additional functional blocks to perform image color balance adjustment.

FIG. 7 is a block diagram of embodiment 700 of SPR module 1408 of FIG. 12. Embodiment 700 encompasses embodiment 100 of FIG. 1 with additional functional blocks to perform image color balance adjustment. As with embodiment 100, the desired rendering mode is selectable by the user of the display. The discussion that follows assumes that the display panel on which the output image is displayed substantially comprises subpixel repeating group 9 as shown in FIG. 12, although it is understood that other subpixel repeating groups may be used. Two additional components include column detector 710 and mode generator 720. These function as detection components to identify portions of the input image data that contain image features or patterns that are susceptible to color balance errors. Column detector 710 detects the column position of the sub-pixel being processed by SPR 700, and in particular in this embodiment, whether the sub-pixel is in the second column or the last column on the display panel. Column detector 710 outputs signals indicating last column and second column. Mode generator 720 detects the pattern of the portion of the input image being processed, and in particular, whether the input image has the specific image pattern that should trigger a different data calculation for the sub-pixel data value. Mode generator 720 produces a mode-out signal 730 for use by Filter Mux 160 to select the appropriate sub-pixel rendering filter.

Figure 8:
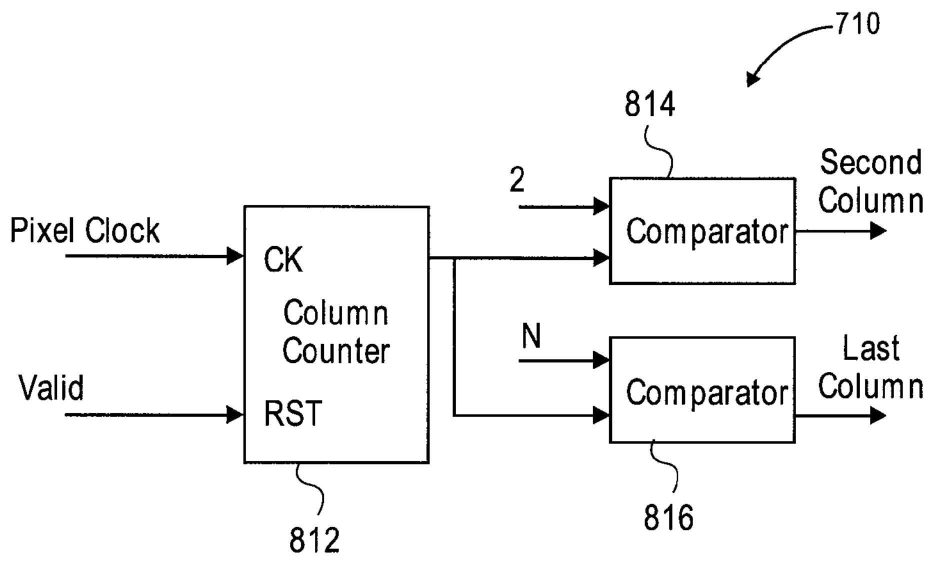
FIG. 8 is a block diagram of the functional components of the column detector component in the embodiment illustrated in FIG. 7.

FIG. 8 illustrates the functional components of column detector 710 in more detail. Column detector 710 comprises column counter 812, second column comparator 814 and last column comparator 816. Column counter 812 counts pixel clocks when input data is valid per each line of input image data. Column counter 812 receives pixel clock and valid inputs. When valid is not active, column counter 812 is in a reset state. When valid is active, column counter 812 counts columns using the pixel clock input, and outputs the current count to second column comparator 814 and last column comparator 816. Second column comparator 814 compares the counter value with a preset value of 2 and generates a pulse when the output value of column counter 812 indicates the sub-pixel being processed is in the second column of the display panel. Last column comparator 916 compares the counter value with a preset value N and generates a pulse when the output value of column counter 812 indicates the sub-pixel being processed is in the last column of the display panel.

Figure 9:
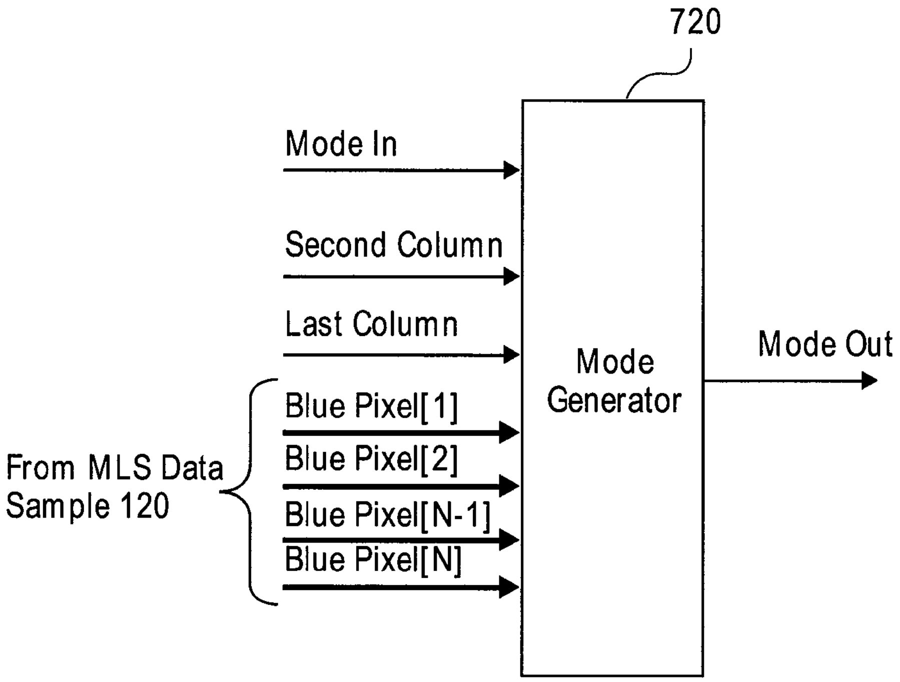
FIG. 9 is a block diagram of the functional components of the mode generator component in the embodiment illustrated in FIG. 7.

FIG. 9 is a block diagram of the interface of mode generator 720. It receives the original mode in signal 180 generated by the display user, the second column and last column signals detected by column detector 710, and the values of blue input data sampled by MLS Data Sample component 120. Mode generator 720 generates a new mode signal based on these inputs.

Mode generator 720 determines whether the input blue pixel data at the left edge and right edge of the input image has data values that indicate an image feature (e.g., a vertical white line adjacent to a dark-colored image region) that is susceptible to color balance errors when processed by the subpixel rendering filter selected by the user according to the Mode In signal 180. In FIG. 9, Blue Pixel[1] refers to the value of the input blue pixel in the first column of the image, and Blue Pixel[2] refers to the value of the input blue pixel in the second column of the image. Blue Pixel[N-1] refers to the value of the input blue pixel in the second-to-last column of the image, and Blue Pixel[N-1] refers to the value of the input blue pixel in the last column of the image.

Figure 10:
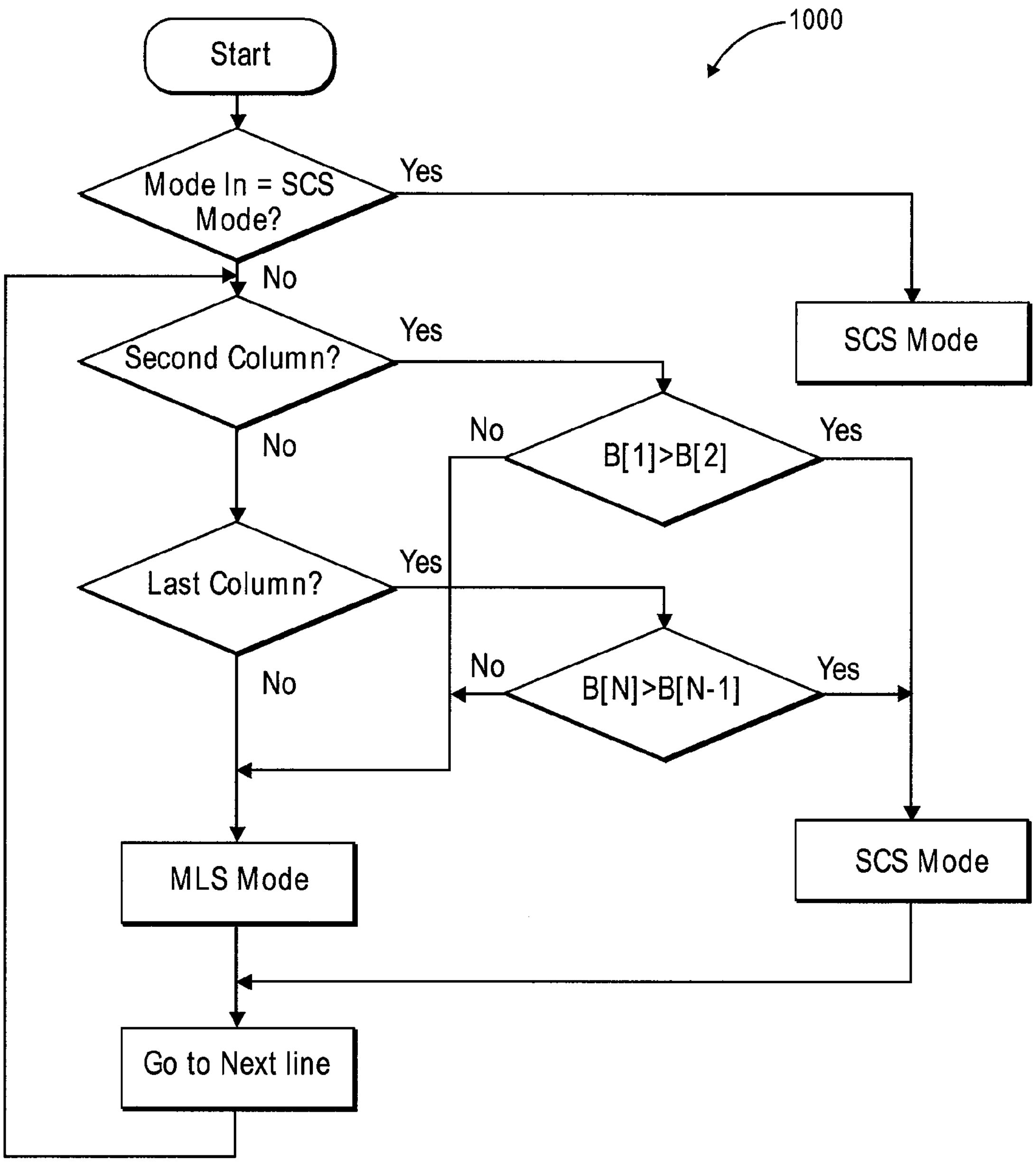
FIG. 10 is a flow diagram of the processing carried out by the mode generator of FIGS. 7 and 9.

FIG. 10 is a flow diagram of the processing carried out by mode generator 720 for the illustrated embodiment where the subpixel rendering of blue subpixels at the edges of the display panel is to be modified when a certain input pattern is detected in the input image.

Table 2 below shows a code representation of the processing. If Mode In signal 180 indicates the MLS mode, mode generator 720 makes determinations as to whether the second column or the last column is currently being processed, so that the input data may be examined for the image pattern being detected. In this particular illustrated embodiment, mode generator 720 determines for input data located on the left edge, if the blue value of the first column is greater than the blue value of the second column. Similarly, for input data located on the right edge, mode generator 720 determines if the blue value in the last column is greater than the blue value of the previous column.

When the second column signal is on, indicating that column detector 710 has detected that a subpixel in the second column is being processed, there is a comparing step to determine if the blue value of the first column is greater than the blue value in the second column. If the results of the comparing step is true, mode generator 720 changes the mode signal to SCS mode (by way of the mode out signal) and SCS image filtering is applied to the subpixel being processed in the second column. In the case of exemplary image 210 of FIG. 6, the second column blue subpixel 620 will be turned off. When the last column signal is on, indicating that column detector 710 has detected that a subpixel in the last column is being processed, there is a comparing step to determine if the blue value of the last column is greater than blue value of the previous column. If the results of this comparing step is true, mode generator 720 changes the mode signal to SCS mode (by way of the mode out signal) and SCS image filtering is applied to the subpixel being processed in the last column. In the case of exemplary image 210 of FIG. 6, the last column blue subpixel 520 will be turned on. If the results of both comparing steps indicates that subpixels in neither the second nor last column are currently being processed, the original mode in signal 180 is left unchanged, and MLS image filtering is applied to compute the value of the subpixel being processed.

By selectively changing which subpixel rendering image filter is applied to certain subpixels on the display panel, the color balance errors as illustrated in FIG. 6 may be corrected such that a human user perceives no color balance error in the white portions at the edges of exemplary image 210.

TABLE 2

```
<Edge Enhancement Algorithm>
If (Mode In = MLS)
    If (second column)
        If (B[1]>B[2])
            take SCS filter
        Else
            take MLS filter
    Else If (last column)
        If (B[N]>B[N−1])
            take SCS filter
        Else
            take MLS filter
```

TABLE 2-continued

```
        Else
            take MLS filter
    Else
        take SCS filter.
```

It will be understood by those skilled in the art that various changes may be made to the exemplary embodiments illustrated herein, and equivalents may be substituted for elements thereof, without departing from the scope of the appended claims. For example, column detector 710 may be configured to detect additional columns, or columns that are different than first and last columns, according to the input image features that are to be detected, according to the subpixel repeating group of the display panel, or according to the subpixel rendering filters being used by the display system. The relationship among these factors may give rise to different types of image artifacts for different images. The SPR component as modified by embodiment 700 of FIG. 7 provides the basic framework for substituting a second subpixel rendering filter for a first subpixel rendering filter for computing the values of certain subpixels on the display panel when the input image data being rendered indicates an image feature that may give rise to a color balance error in the displayed output image.

While embodiment 700 has been illustrated with subpixel repeating group 9 configured with two rows and four columns of subpixels, the display panel may be configured with subpixel repeating group 9 rotated ninety degrees (90°) to the left (or right) to form a subpixel repeating group comprising four rows and two columns, as follows:

| | |
|---|---|
| W | G |
| B | R |
| G | W |
| R | B |

A person of skill in the art will recognize that an exemplary image may exhibit a different color balance error on this display panel than it would exhibit on the display panel configured as shown in FIG. 4. Color balance errors in images may be perceived to occur in rows rather than in columns on such a display, and, depending on the image, the color balance error may be introduced by the red or green subpixels, and not the blue subpixels. Embodiment 700 may be modified to detect which rows of subpixels, instead of columns, of subpixels are being processed, or to detect an input image pattern using a different color subpixel.

The display system illustrated herein, and the methods and techniques discussed herein, may be implemented in all manners of display technologies, including transmissive and non-transmissive display panels, such as Liquid Crystal Displays (LCD), reflective Liquid Crystal Displays, emissive ElectroLuminecent Displays (EL), Plasma Display Panels (PDP), Field Emitter Displays (FED), Electrophoretic displays, Iridescent Displays (ID), Incandescent Display, solid state Light Emitting Diode (LED) display, and Organic Light Emitting Diode (OLED) displays.

Therefore, it is intended that the appended claims include all embodiments falling within their scope, and not be limited to any particular embodiment disclosed, or to any embodiment disclosed as the best mode contemplated for carrying out this invention.

What is claimed is:

1. A display system comprising a source image receiving unit configured for receiving source image data indicating an input image; said source image data being arranged in rows and columns of color data values specified in a first data format;

a display panel substantially comprising a plurality of a subpixel repeating group tiled across said display; said subpixel repeating group comprising at least two rows and at least two columns of at least two primary color subpixels; an arrangement of said primary colors in said subpixel repeating group defining a second data format;

subpixel rendering circuitry configured for computing a luminance value for each subpixel on said display panel in said second data format using said source image data in said first data format and a first subpixel rendering image filter;

subpixel location detection circuitry configured for detecting whether a subpixel being processed by said subpixel rendering circuitry is located in one of a target row and column location of said display panel; said subpixel location detection circuitry producing a location signal;

said subpixel rendering circuitry being further configured for using a second subpixel rendering image filter in place of said first subpixel rendering image filter to compute said luminance value for said subpixel when said location signal indicates that said subpixel being processed by said subpixel rendering circuitry is located in one of said target row and column location of said display panel; and driver circuitry configured to send signals indicating luminance values to said subpixels on said display panel to render said output image.

2. The display system of claim 1 wherein said display panel substantially comprises a plurality of a subpixel repeating group, said group further comprising at least one white subpixel.

3. The display system of claim 1 wherein said subpixel repeating group comprises one of a group, said group comprising:

| | | | | | |
|---|---|---|---|---|---|
| RGBW<br>BWRG, | RBGW<br>GWRB, | RBG<br>GWR, | RBG<br>GBR, | RGBG<br>BGRG, | RBGB<br>GBRB. |

4. The display system of claim 1 wherein said first subpixel rendering image filter is capable of chromatic aliasing at the edge of said display panel.

5. The display system of claim 1 wherein said first subpixel rendering image filter comprises a meta-luma sharpening filter.

6. The display system of claim 1 wherein said subpixel rendering circuitry further comprises mode generator, said mode generator capable of generating a signal for the selection of subpixel rendering image filter upon receipt of a column detection signal indicating an edge of display rendering condition.

7. A method of preventing chromatic aliasing at an edge of an image displayed upon display system, said display system employing subpixel rendering of image data upon a display, said method comprising:

receiving source image data;

subpixel rendering with a first image filter said source image data into intermediate image data on a pixel by pixel basis; and detecting, based on a column count that is maintained for said current pixel being subpixel rendered, a display edge condition for the current pixel data being subpixel rendered; and selecting a second image filter for subpixel rendering said current pixel data.

8. The method of claim 7 wherein said step of subpixel rendering further comprises rendering source image data with a meta-luma sharpening filter.

9. The method of claim 7 wherein said step of selecting a second image filter further comprises a second image filter, said second image filter creating substantially less chromatic aliasing at the edge of said display than said first image filter.

* * * * *